May 14, 1963 M. M. DEEVY 3,089,234

METHOD OF MAKING METAL-TO-CERAMIC SEALS

Filed Feb. 1, 1960

INVENTOR.
Margaret M. Deevy
BY William A. Zalesak
ATTORNEY

United States Patent Office 3,089,234

Patented May 14, 1963

3,089,234

METHOD OF MAKING METAL-TO-CERAMIC SEALS

Margaret M. Deevy, North Arlington, N.J., assignor to Radio Corporation of America, a corporation of Delaware Filed Feb. 1, 1960, Ser. No. 5,922
7 Claims. (Cl. 29—473.1)

My invention relates to vacuum tight seals and more particularly to improvements in metal-to-ceramic seals useful in electron discharge devices and to the method of making such seals.

One form of recently designed electron discharge device in which my invention is particularly useful includes a structure comprising a flat wafer or disk header made, for example, of a ceramic material such as forsterite and having openings extending therethrough, the walls of said openings being coated with a suitable bonding material such as molybdenum. Lead-in and support conductors, preferably of molybdenum, and extending through the openings in the wafer are bonded, for example, by brazing, to the metal coating providing a relatively rugged and hermetic seal between the conductors and the wafer. The lead-in conductors and supports extend into the tube envelope, which is sealed to the periphery of the wafer, and are fixed as by brazing to the tube parts within the envelope.

It is necessary to obtain vacuum tight seals between the lead-in and support conductors and the metalized walls of the holes in the ceramic stem wafer by a brazing operation. To do this, copper washers are placed over the leads adjacent the header wafer before the brazing operation takes place. The brazing cycle is limited in time and temperature by the materials and structure of the mount assembly and the jigs used. With materials normally used, brazing is preferably done at a temperature of 1130° C. for a period of two minutes.

It has not always been possible to obtain a consistently good seal between the lead-in and support conductors and the metalized walls of the holes in the header wafer because the copper did not always flow over the conductor surfaces for properly wetting the surfaces and into the holes to completely close the gap between the conductors and the metalized walls of the holes in the wafer.

I have also found that the conductors exhibit a tendency to hang up in brazing operations. As a result, due to different coefficients of expansion of the various metals used, a conductor which hangs up in a hole due to friction between the conductor and the hole is pulled away from its contacting electrode support and thus prevents a good brazed contact between this conductor and the support to which it is to be brazed.

It is an object of my invention to provide an improved vacuum tight metal-to-ceramic seal particularly useful in the manufacture of electron discharge devices but not limited thereto.

A further and more specific object of my invention is to provide an improved method of forming a vacuum tight metal-to-ceramic seal particularly in connection with the sealing of molybdenum lead-in and support conductors in a ceramic header member.

In accordance with my invention, I coat the conductor or metallic member of molybdenum with a thin film of graphite. The conductor, for example in the form of a lead-in, may then be properly positioned within a hole in the ceramic member which receives the conductor. The walls of the hole are metalized preferably with molybdenum. A copper brazing ring is placed over the conductor preferably in contact with the ceramic member. The assembly is then heated to a brazing temperature causing the copper of the ring to melt, flow over the molybdenum conductor and between the conductor and the metalized wall of the hole in the ceramic wafer to form the seal. The assembly may then be cooled to set the parts and then cooled to room temperature and the assembly removed from the jig.

Referring to the drawings.

Figure 1:
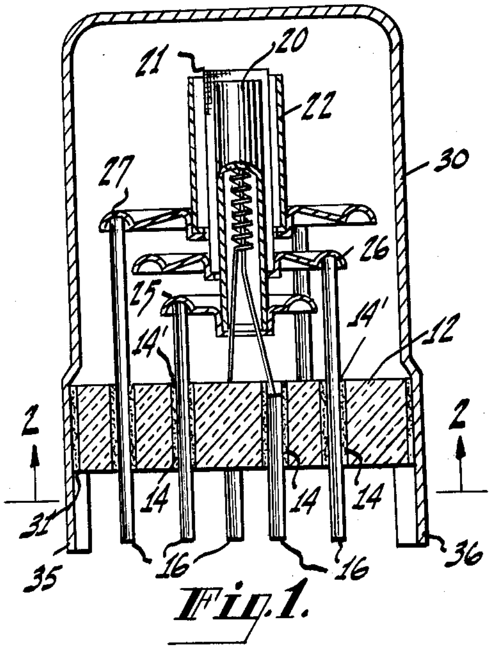
FIGURE 1 is a longitudinal section of one form of electron discharge device using my invention.

One form of electron discharge device with which my invention can be used is shown in FIGURE 1. It comprises a header wafer 12 of ceramic material provided with a plurality of apertures 14 extending therethrough. The holes may be of very small diameter of the order of 17.1 to 17.5 mils after being metalized. Lead-in and support conductors 16 extend through these apertures. These conductors may have a diameter of the order of 15.4 to 15.7 mils. The conductors are sealed vacuum tight within the header member by a metalized coating 14', for example, of molybdenum. These conductors 16 are brazed to the header member during manufacture as will be described below. Supported within the envelope and in coaxial relationship are the cathode 20, control grid 21 and anode 22. These electrodes are supported on the flanges 25, 26 and 27, respectively, which are brazed to and are in electrical contact with the upper ends of the lead-in and supporting conductors 16. The envelope 30 encloses the electrodes and is sealed vacuum tight to the header member 12 by a metal coating 31, preferably of molybdenum. The envelope is evacuated.

Figure 2:
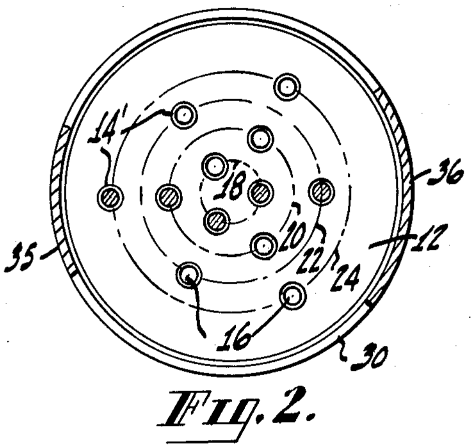
FIGURE 2 is a bottom view taken along the line 2—2 of FIG. 1.

FIG. 2 shows the arrangement of the lead-in and support conductors extending through the base wafer 12 and lying in the concentric circles 18, 20, 22 and 24. Indexing lugs for registering the device in appropriate sockets include the arcuate shaped extensions 35 and 36 integral with the envelope.

In accordance with my invention, I apply a very thin film of graphite to the molybdenum conductors prior to insertion of the conductors within the apertures of the header member. I then assemble the parts within a jig as described below.

The method of assembly involves the use of a jig adapted to receive and support individual tube parts in strain-free relation during brazing together of the parts to form the electrode mount assembly. The jig may be made of a suitable metal or ceramic material adapted to withstand elevated temperatures. This permits the jig with the parts loaded thereon to be placed in a hydrogen furnace having a sufficiently high temperature for sealing the lead-in and support conductors to the metalized coatings in the stem openings through which they extend, and for brazing end portions of the lead-ins to the collar supports.

Figure 3:
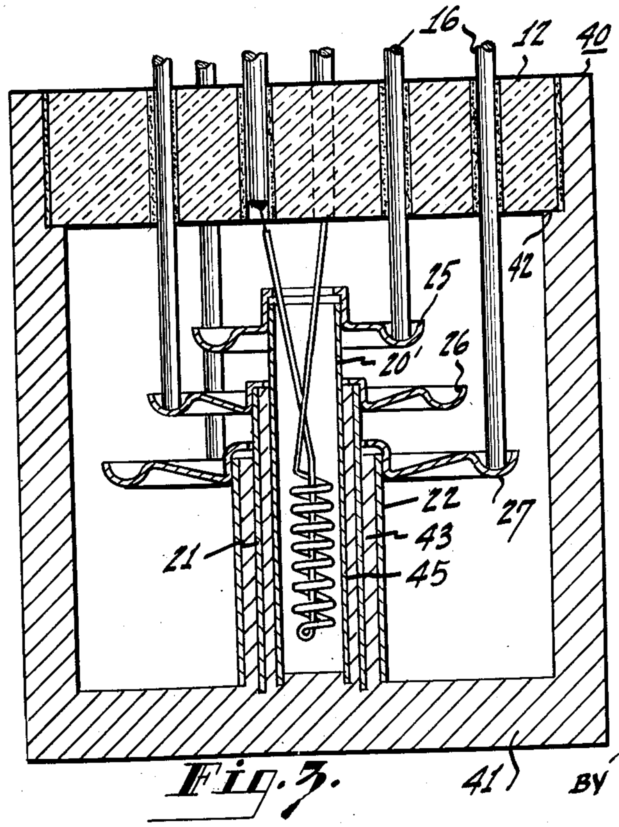
FIGURE 3 is a longitudinal section of the lead-in and support conductors, electrodes and ceramic header member of the device shown in FIG. 1 and mounted in a jig for brazing operations.

In assembling the header wafer 12, electrodes and coated conductors 16 prior to enclosure within the envelope 30, the parts are all positioned within a jig 40 having a closed bottom 41 as shown in FIG. 3. The jig of suitable material such as ceramic or metal, for example, a nickel-chrome alloy, is provided with a shoulder 42. The jig is provided coaxial with its longitudinal axis with a pair of tubular members 43 and 45 which are coaxial and concentric with each other, the tubular member 43 being shorter than the sleeve 45. The various parts are assembled within the jig in the relationship shown in FIG. 3. The anode 22, grid 21 and cathode support sleeve 20' are located between the tubular members 43 and 45.

In loading the jig, the tubular cathode supporting sleeve, cylindrical grid 21, and cylindrical anode 22 are positioned successively within the jig in concentric and suitably spaced relation. The collars or flanges 25, 26 and 27 may be loaded when the electrodes are loaded or afterwards to engage and rest on the upper ends of the electrode elements. The cathode heater 23 may be positioned in the cathode sleeve at any stage of the foregoing procedure after the cathode sleeve has been loaded. Thereafter the wafer or disc 12 which has had the walls of the apertures therein previously metalized, is positioned on the shoulder 42 of the jig which disposes the wafer above the electrodes and in coaxial relation and with the heater legs extending partly through openings in the wafer.

Figure 4:
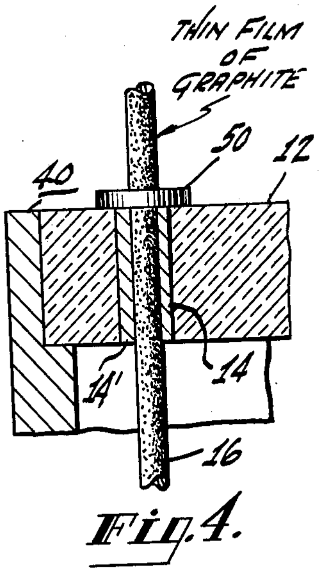
FIGURE 4 is a transverse section of a portion of the header member and lead-in conductor shown in FIG. 3 and showing a step in the method employed in practicing my invention.

The lead-in and support conductors 16 which are preferably of molybdenum are positioned in contacting relationship with the flanges 25, 26 and 27 by being inserted through the header wafer 12 positioned on the shoulder 42. Copper brazing rings 50 (see FIGURE 4) are disposed over and around the conductors and preferably rest against the header wafer 12 during brazing operations.

The jig and the parts assembled therein are then placed within a brazing furnace and fired preferably in an atmosphere of hydrogen at a temperature of about 1100° C. to 1130° C., for one and one-half to two minutes to cause the copper to flow over the conductors and between the lead-in and support conductors and the metallized walls of the apertures to provide a vacuum tight braze. The jig and assembly are then allowed to cool to a temperature of 250° for about two minutes. The assembly is then removed from the jig and allowed to cool to room temperature.

To provide an emitting surface on the cathode sleeve, a metal cup carrying an emitting coating is telescoped over the cathode sleeve. A shell, providing the tube envelope, such as of metal or ceramic, is then telescoped over the assembled tube structure, the tube baked out and exhausted. The rim of the shell is then brazed to the periphery of the wafer.

I have found that leads of molybdenum wire (coated with a thin film of graphite) have an improved wettability over leads of clean molybdenum, or over copper-plated molybdenum leads, when the stem assemblies are brazed in hydrogen at around 1130° C. The copper flows freely over the surface of the molybdenum and fills in the gaps between leads and holes in the stem wafer. In general, the copper flows freely over the entire lead surface both up and down with respect to the position of the copper brazing ring.

I have found that graphite coatings of about between .04 to .08 mils in thickness provide satisfactory seals. I have also found that not only is a good seal provided but that "hanging up" is also eliminated.

It is believed that the explanation for poor copper flow on bright molybdenum leads is that a thin surface layer of molybdenum oxide is formed that keeps the copper from wetting the molybdenum. When conductors covered with graphite are brazed in the hydrogen furnace, it is believed that the carbon tends to reduce any oxides on the leads and therefore produces better surface-wetting by the copper.

In addition to providing a reliable and low-cost method of obtaining a surface of good wettability, the graphite coated molybdenum leads can also be readily applied to automatic-assembly techniques in which the wire is fed from spools into an assembly mechanism.

The graphite coated molybdenum lead conductors have a relatively smooth surface and do not exhibit any tendency to "hang up" in the brazing operation; that is, when the parts reach brazing temperature and the copper brazing metal flows, the lead conductors fall freely in the holes and continue to contact the electrode flanges in the mount assembly.

What is claimed is:

1. The method of forming a vacuum tight seal between a conductor of molybdenum and a ceramic member having an aperture for receiving said conductor therein, comprising metalizing the walls of said aperture to provide a coating of molybdenum, coating the conductor with a graphite film, inserting said coated conductor within said aperture, applying a brazing ring to said conductor, and subjecting said ceramic member and said coated conductor to a temperature of about 1130° C. for approximately two minutes to braze said conductor to said ceramic member with a vacuum tight seal.

2. The method of forming a vacuum tight seal between a conductor of molybdenum and a ceramic member having an aperture therein for receiving said lead, said aperture having a metalized wall of molybdenum, comprising coating said conductor with a thin film of carbon particles, inserting said conductor within said aperture, applying a brazing ring of copper to said conductor adjacent the aperture in said ceramic member, and subjecting said ceramic member, said coated conductor and said brazing ring to a brazing temperature for sufficient time to cause said copper to melt and flow over said conductor and to fill the space between said conductor and the metalized wall of said aperture to braze said conductor to said ceramic member with a vacuum tight seal.

3. The method of forming a vacuum tight seal between a conductor of molybdenum and a ceramic member having an aperture for receiving said lead-in conductor therein, comprising metalizing the walls of said aperture with a coating of molybdenum, coating said conductor with a thin graphite film, inserting said coated conductor within said aperture, applying a brazing ring of copper to said lead-in conductor, and subjecting said ceramic member, coated conductor and brazing ring to a brazing temperature for a sufficient period of time to melt said copper to cause said copper to flow over said conductor and to fill the space between the conductor and the walls of said aperture to braze said lead-in conductor to said ceramic member with a vacuum tight seal.

4. The method of forming a vacuum tight seal between a conductor of molybdenum and a ceramic member having an aperture for receiving said conductor therein, the walls of said aperture having a metalized coating of molybdenum thereon, comprising coating said conductor with a thin graphite film of of the order of .04 to .08 mil in thickness, inserting said coated conductor within said aperture, applying a brazing ring of copper to said lead-in conductor, and subjecting the assembly of said ceramic member, coated lead-in conductor and brazing ring to a brazing temperature of about 1130° C. for a sufficient period of time to melt said copper to cause said copper to flow over said conductor and to fill the space between the conductor and the walls of said aperture to braze said conductor to said ceramic member with a vacuum tight seal.

5. The method of forming hermetic seals between a plurality of molybdenum conductors and a ceramic member having a plurality of apertures therein for receiving said conductors, said apertures having metalized walls of molybdenum, comprising coating said conductors with a thin film of graphite of the order of .04 to .08 mil in thickness, inserting said conductors within said apertures, applying brazing rings of copper to said conductors adjacent the apertures in said ceramic member, and subjecting said ceramic member, said conductors and said brazing rings to a brazing temperature of about 1130° C. for a period of one and one-half to two minutes to cause the copper rings to melt and flow over said conductors and to fill up the space between said conductors and the walls of said apertures to braze said conductors to said ceramic member with vacuum tight seals.

6. The method of forming a vacuum tight seal between a conductor of molybdenum and a ceramic member having an aperture therein for receiving said conductor, said aperture having a metalized wall, comprising the steps of coating said conductor with a thin film of carbon particles, inserting said conductor within said aperture, applying a brazing material including copper, and subjecting said ceramic member, said coated conductor and said brazing material to a brazing temperature for sufficient time to cause said copper to melt and flow over said conductor and to fill the space between said conductor and the metalized wall of said aperture to braze said conductor to said ceramic member with a vacuum tight seal.

7. The method of forming a vacuum tight seal between a conductor of molybdenum and a ceramic member having an aperture for receiving said conductor therein, the walls of said aperture having a metalized coating thereon, comprising the steps of coating said conductor with a thin graphite film of the order of .04 to .08 mil in thickness, inserting said conductor within said aperture, applying a brazing material including copper, subjecting the assembly of said ceramic member, said coated lead-in conductor and brazing material to a brazing temperature of from 1100° to 1130° C. for a sufficient period of time to melt said brazing material to cause the brazing material to flow over said conductor and to fill the space between the conductor and the walls of said aperture to braze said conductor to said ceramic member with a vacuum tight seal.

References Cited in the file of this patent

UNITED STATES PATENTS

| | | |
|---|---|---|
| 1,931,874 | Mendenhall | Oct. 24, 1933 |
| 1,981,652 | Long | Nov. 20, 1934 |
| 2,092,557 | Quarnstrom | Sept. 7, 1937 |
| 2,163,408 | Pulfrich | June 20, 1939 |
| 2,163,409 | Pulfrich | June 20, 1939 |
| 2,369,537 | Crawford | Feb. 13, 1945 |
| 2,508,465 | Offinger et al. | May 23, 1950 |
| 2,527,587 | Smyth | Oct. 31, 1950 |
| 2,714,760 | Boam et al. | Aug. 9, 1955 |
| 2,728,425 | Day | Dec. 27, 1955 |
| 2,776,472 | Mesrick | Jan. 8, 1957 |
| 2,798,577 | La Forge | July 9, 1957 |
| 2,806,596 | Dodds et al. | Sept. 17, 1957 |